United States Patent
Oka et al.

(10) Patent No.: US 6,815,788 B2
(45) Date of Patent: Nov. 9, 2004

(54) CRYSTALLINE SILICON THIN FILM SEMICONDUCTOR DEVICE, CRYSTALLINE SILICON THIN FILM PHOTOVOLTAIC DEVICE, AND PROCESS FOR PRODUCING CRYSTALLINE SILICON THIN FILM SEMICONDUCTOR DEVICE

(75) Inventors: Fumihito Oka, Tokyo (JP); Shinichi Muramatsu, Tokyo (JP); Yasushi Minagawa, Tokyo (JP)

(73) Assignee: Hitachi Cable Ltd., Tokyo (JP)

( * ) Notice: Subject to any disclaimer, the term of this patent is extended or adjusted under 35 U.S.C. 154(b) by 0 days.

(21) Appl. No.: 09/925,626

(22) Filed: Aug. 10, 2001

(65) Prior Publication Data

US 2003/0030052 A1 Feb. 13, 2003

(51) Int. Cl.$^7$ .................. H01L 31/075; H01L 31/105; H01L 31/117; H01L 29/04
(52) U.S. Cl. .................. 257/458; 257/65; 257/233
(58) Field of Search .................. 136/258; 257/65, 257/75, 53, 54, 233, 458, 749

(56) References Cited

U.S. PATENT DOCUMENTS

| 5,797,999 A | 8/1998 | Sannomiya et al. | ........ 136/258 |
| 6,337,224 B1 * | 1/2002 | Okamoto et al. | ............. 438/69 |
| 2002/0011264 A1 * | 1/2002 | Saito | ......................... 136/258 |

FOREIGN PATENT DOCUMENTS

JP            09-82997         3/1997

OTHER PUBLICATIONS

Guliants et al., Photovoltaic Specialists Conference, Sep. 15–22, 2000, IEEE, pp. 154–157.*
Yamamoto et al. Central Research Laboratories, Kaneka Corporation, Japan "Thin–Film Polycrystalline Si Solar Cell on Glass Substrate Fabricated by a Novel Low Temperature Process" IEEE, Dec. 5–9, 1994, pp. 1575–1578.

* cited by examiner

*Primary Examiner*—Shouxiang Hu
(74) *Attorney, Agent, or Firm*—Antonelli, Terry, Stout & Kraus, LLP

(57) ABSTRACT

A transparent electrode is provided on a glass substrate, and an amorphous silicon layer is provided on the transparent electrode. A nickel layer as a metal catalyst element is provided in or so as to contact with the surface of the amorphous silicon layer, followed by heat treatment to crystallize the amorphous silicon layer, thereby forming a p-type polycrystalline silicon layer. This polycrystalline silicon layer is crystallographically oriented and has high crystallinity. The polycrystalline silicon layer is used as a seed crystal to form a p-type polycrystalline silicon layer which is crystallographically oriented and, at the same time, has high crystallinity. Further, an i-type polycrystalline silicon layer and an n-type polycrystalline silicon layer are successively formed on the polycrystalline silicon layer. By virtue of the above construction, a crystalline silicon thin film semiconductor device, a crystalline silicon thin film photovoltaic device, and a process for producing a crystalline silicon thin film semiconductor device can be provided which can realize high crystallinity of polycrystalline silicon, crystallographic orientation, high characteristics, and excellent productivity.

34 Claims, 3 Drawing Sheets

FIG. 5

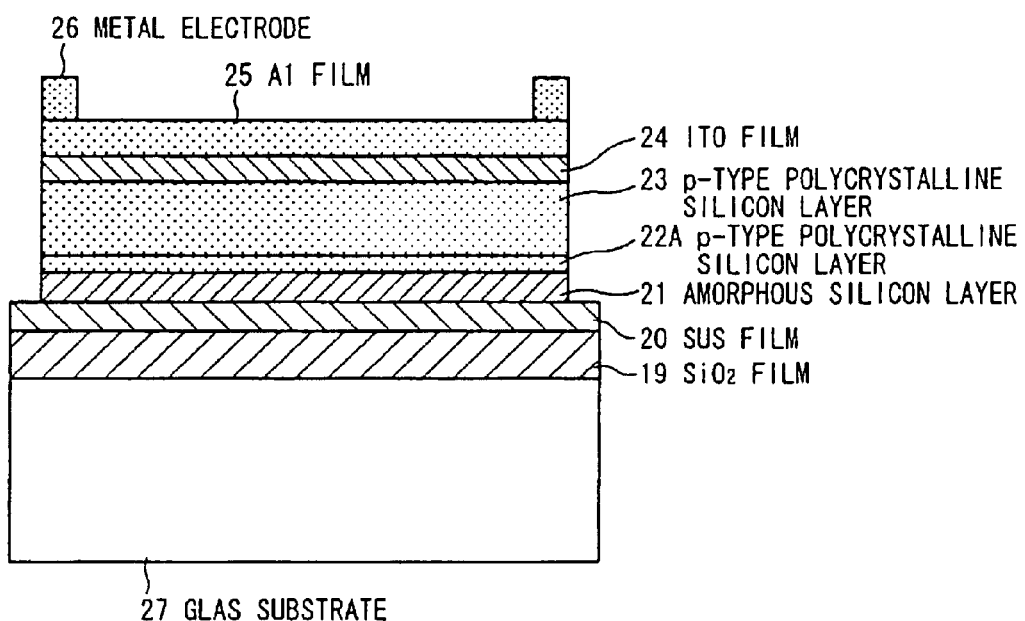

- 26 METAL ELECTRODE
- 25 Al FILM
- 24 ITO FILM
- 23 p-TYPE POLYCRYSTALLINE SILICON LAYER
- 22A p-TYPE POLYCRYSTALLINE SILICON LAYER
- 21 AMORPHOUS SILICON LAYER
- 20 SUS FILM
- 19 SiO₂ FILM
- 27 GLAS SUBSTRATE

FIG. 6

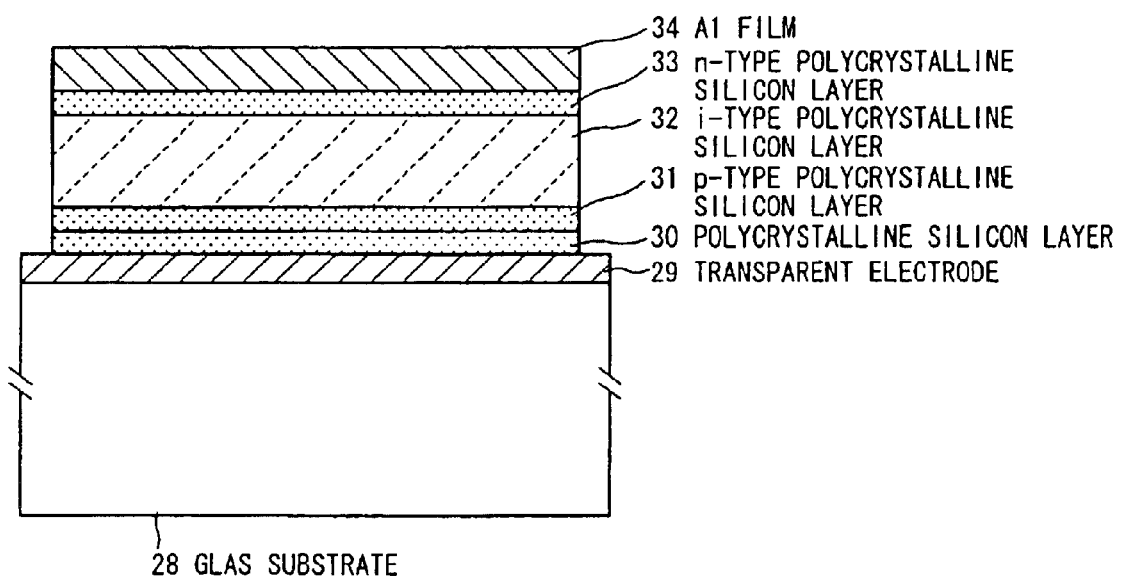

- 34 Al FILM
- 33 n-TYPE POLYCRYSTALLINE SILICON LAYER
- 32 i-TYPE POLYCRYSTALLINE SILICON LAYER
- 31 p-TYPE POLYCRYSTALLINE SILICON LAYER
- 30 POLYCRYSTALLINE SILICON LAYER
- 29 TRANSPARENT ELECTRODE
- 28 GLAS SUBSTRATE

CRYSTALLINE SILICON THIN FILM SEMICONDUCTOR DEVICE, CRYSTALLINE SILICON THIN FILM PHOTOVOLTAIC DEVICE, AND PROCESS FOR PRODUCING CRYSTALLINE SILICON THIN FILM SEMICONDUCTOR DEVICE

BACKGROUND OF THE INVENTION

1. Field of the Invention

The invention relates to a crystalline silicon thin film semiconductor device, a crystalline silicon thin film photovoltaic device, and a process for producing a crystalline silicon thin film semiconductor device, and more particularly to a crystalline silicon thin film semiconductor device, a crystalline silicon thin film photovoltaic device, and a process for producing a crystalline silicon thin film semiconductor device, wherein a polycrystalline silicon thin film is formed using amorphous silicon as a seed crystal.

2. Prior Art

In semiconductor devices, such as solar cells, in order to form a high-quality crystalline silicon device having a thickness of about 1 to 4 $\mu$m on a glass substrate having thereon a conductive film (layer), a high-quality seed crystal should be formed directly on the glass substrate having thereon a conductive film. Requirements to be satisfied in the formation of this seed crystal include:

(1) high crystallinity (high degree of crystallization);

(2) crystallographic orientation;

(3) large throughput at a time; and (4) low-temperature process which permits the use of general glass substrates.

In the production of solar cells, a production process has hitherto been adopted wherein a polycrystalline silicon thin film is formed on a dissimilar substrate, such as glass. According to this production process, there is no need to use large-area and high-quality silicon crystal substrates, and, thus, a significant reduction in cost can be expected. In the production of semiconductor devices having good characteristics, however, the quality of polycrystalline silicon thin films should be improved. To this end, in general, quartz or the like, which can withstand high temperature, is used as the substrate, and this substrate is subjected to high-temperature deposition treatment to form a silicon thin film having good crystallinity. In this production process, however, since expensive substrates, such as quartz, are used, a reduction in cost cannot be realized.

In order to solve this problem, a method has been proposed in K. Yamomoto et al., IEEE "First World Conference on Photovoltaic Energy Conversion," 1575–1578 (1994). According to this method, amorphous thin film silicon is melted and crystallized, for example, by laser annealing to form a film on the surface of a substrate, thereby producing polycrystalline thin film silicon having good crystallinity. This method is advantageous in that, since the temperature rise of the substrate can be suppressed, the use of low-cost substrate materials becomes possible. Further, an attempt to form polycrystalline silicon directly, for example, on a glass substrate having thereon a conductive film by plasma CVD (plasma chemical vapor deposition) has also been made.

Another method for solving the above problem is proposed in Japanese Patent Laid-Open No. 82997/1997. According to this method, amorphous silicon is crystallized by a metal catalyst to crystallize all crystalline layers of the same p- or n-conductivity type or all crystalline layers of the same p- or n-conductivity type including a BSF (back surface field) layer.

According to the conventional crystalline silicon thin film semiconductor device and crystalline silicon thin film photovoltaic device, however, when the amorphous silicon is crystallized on the glass substrate by laser annealing, a large number of substrates cannot be treated at a time without difficulties. This poses a problem of throughput. Specifically, in order to convert amorphous thin film silicon by melt crystallization to a polycrystalline layer having an even grain diameter, a method should be used which comprises forming amorphous thin film silicon by plasma CVD, thermally releasing hydrogen contained in the amorphous thin film silicon, and then performing laser annealing. Therefore, the production of products involves a lot of troubles and a lot of time which lead to increased cost.

On the other hand, the production process, wherein polycrystalline silicon is formed directly on glass substrates or the like by plasma CVD, has problems of quality, such as low crystallinity of the resultant polycrystalline silicon. In a pn structure and a pin structure which are generally adopted in solar cells, a p-conductivity-type or n-conductivity-type polycrystalline silicon thin film should be formed directly on a glass substrate having on its surface a conductive film. However, the polycrystalline silicon thin film, which has been formed directly on the glass substrate by plasma CVD, is known to have problems such as low crystallinity and short carrier life time. In particular, p-conductivity-type polycrystalline silicon thin films formed by plasma CVD involve problems of very low crystallinity and poor crystallographic orientation which are serious technical problems.

Further, according to the method disclosed in Japanese Patent Laid-Open No. 82997/1997, nickel silicide (alloy of silicon with nickel) is likely to be left at a junction with other conductivity type. Further, even when the residual nickel silicide has been removed by etching, defects are likely to occur. Therefore, recombination at the junction increases. This leads to a fear of characteristics of solar cell devices being significantly lowered.

SUMMARY OF THE INVENTION

Accordingly, it is an object of the invention to provide a crystalline silicon thin film semiconductor device, a crystalline silicon thin film photovoltaic device, and a process for producing a crystalline silicon thin film semiconductor device which can realize high crystallinity of polycrystalline silicon, excellent crystallographic orientation, high characteristics, and high productivity.

According to the first feature of the invention, a crystalline silicon thin film semiconductor device comprises:

a conductive substrate or a substrate having on its surface a conductive layer;

a crystallographically oriented first polycrystalline silicon layer which has been formed by introducing a metal catalyst element into an amorphous silicon layer, formed on the surface of the conductive substrate or the conductive layer, or so as to come into contact with the surface portion of the amorphous silicon layer, and heat treating the amorphous silicon layer to crystallize the amorphous silicon layer; and a second polycrystalline silicon layer which has been formed, using the first polycrystalline silicon layer as a seed crystal, so as to have the same conductivity type as the first polycrystalline silicon layer.

According to this construction, a metal catalyst element is introduced into an amorphous silicon layer, provided on a substrate, or so as to come into contact with the amorphous silicon layer, followed by heat treatment to convert the amorphous silicon layer at a low temperature through the action of the metal catalyst element to a crystallographically oriented first polycrystalline silicon layer. When this first silicon layer is used as a seed crystal to form a second polycrystalline silicon layer on the surface of the first silicon layer, the resultant second polycrystalline silicon layer has the same crystallographic orientation as the first polycrystalline silicon layer as the substrate and high crystallinity. Likewise, the third polycrystalline silicon layer formed using the second polycrystalline silicon layer as a substrate has high crystallinity and is crystallographically oriented. As a result, a crystalline silicon thin film semiconductor device can be produced which can realize high crystallinity, excellent crystallographic orientation, high characteristics, and high productivity. Further, no silicide is left at a junction with other conductivity type. Therefore, there is no need to provide the step of removing silicide, and no defect attributable to silicide occurs.

According to the second feature of the invention, a crystalline silicon thin film photovoltaic device comprises:

a conductive substrate or an insulating substrate having on its surface a conductive layer;

a first polycrystalline silicon layer of a first conductivity type which has been formed by introducing a metal catalyst element into an amorphous silicon layer, formed on the surface of the conductive substrate or the conductive layer, or so as to come into contact with the surface portion of the amorphous silicon layer, and heat treating the amorphous silicon layer to crystallize the amorphous silicon layer;

a second polycrystalline silicon layer which has been formed, using the first polycrystalline silicon layer as a seed crystal, so as to have the same conductivity type as the first conductivity type;

a substantially i-type third polycrystalline silicon layer provided on the second polycrystalline silicon layer;

a fourth polycrystalline silicon layer that is provided on the third polycrystalline silicon layer and is of a second conductivity type which is different from the first conductivity type; and an electrode part provided on the fourth polycrystalline silicon layer.

According to the third feature of the invention, a crystalline silicon thin film photovoltaic device comprises:

an insulating substrate having on its surface an electrode;

a first polycrystalline silicon layer of a first conductivity type which has been formed by introducing a metal catalyst element into an amorphous silicon layer, formed on the electrode of the insulating substrate, or so as to come into contact with the surface portion of the amorphous silicon layer, and heat treating the amorphous silicon layer to crystallize the amorphous silicon layer;

a second polycrystalline silicon layer which has been formed, using the first polycrystalline silicon layer as a seed crystal, so as to have the same conductivity type as the first conductivity type;

a third polycrystalline silicon layer which is provided on the second polycrystalline silicon layer and is of a second conductivity type which is different from the first conductivity type; and an electrode part provided on the third polycrystalline silicon layer.

In the construction of the second and third features of the invention, a metal catalyst element is introduced into an amorphous silicon layer, provided on a substrate, or so as to come into contact with the amorphous silicon layer, followed by heat treatment to convert the amorphous silicon layer at a low temperature through the action of the metal catalyst element to a crystallographically oriented first polycrystalline silicon layer. When this first silicon layer is used as a seed crystal to form a second polycrystalline silicon layer on the surface of the first silicon layer, the resultant second polycrystalline silicon layer has the same crystallographic orientation as the first polycrystalline silicon layer as the substrate and high crystallinity. Likewise, the third polycrystalline silicon layer formed using the second polycrystalline silicon layer as a substrate has high crystallinity and is crystallographically oriented. Therefore, a crystalline silicon thin film photovoltaic device can be produced which can realize high crystallinity, crystallographic orientation, high characteristics, and excellent productivity.

According to the fourth feature of the invention, a process for producing a crystalline silicon thin film semiconductor device, comprises the steps of:

providing a conductive substrate or a substrate having on its surface a conductive layer and forming an amorphous silicon thin film on the surface of the conductive substrate or the surface of the conductive layer in the substrate;

introducing a metal catalyst element into the amorphous silicon layer or so as to come into contact with the surface portion of the amorphous silicon layer, and heat treating the amorphous silicon layer to crystallize the amorphous silicon layer and to form a crystallographically oriented first polycrystalline silicon layer;

forming, on the first polycrystalline silicon layer, a second polycrystalline silicon layer, of the same conductivity type as the first polycrystalline silicon layer, using the first polycrystalline silicon layer as a seed crystal; and forming, on the second polycrystalline silicon layer, a third polycrystalline silicon layer of a second conductivity type which is different from the conductivity type of the second polycrystalline silicon layer.

According to this production process, an amorphous silicon thin film is formed on the surface of a substrate, and a metal catalyst element is introduced into the amorphous silicon layer or so as to come into contact with the surface portion of the amorphous silicon layer, followed by heat treatment of the amorphous silicon layer. This can crystallize the amorphous silicon layer at a low temperature to form a crystallographically oriented first polycrystalline silicon layer. When this first polycrystalline silicon layer is used as a seed crystal to form, on the first polycrystalline silicon layer, a second polycrystalline silicon layer of the same conductivity type as the first polycrystalline silicon layer, the second polycrystalline silicon layer has the same crystallographic orientation as the first polycrystalline silicon layer. Further, a third polycrystalline silicon layer, of the conductivity type which is different from that of the second polycrystalline silicon layer, is formed on the second polycrystalline silicon layer to constitute a semiconductor device having a pn structure. Therefore, a crystalline silicon thin film semiconductor device can be produced which can realize high crystallinity, crystallographic orientation, high characteristics, and excellent productivity.

BRIEF DESCRIPTION OF THE DRAWINGS

The invention will be explained in more detail in conjunction with the appended drawings, wherein:

FIG. 5 is a schematic cross-sectional view showing a halfway stage in the production of a solar cell according to a fourth preferred embodiment of the invention; and FIG. 6 is a schematic cross-sectional view showing a solar cell according to a fifth preferred embodiment of the invention.

DESCRIPTION OF THE PREFERRED EMBODIMENTS

Preferred embodiments of the invention will be explained in conjunction with the accompanying drawings.

(First Preferred Embodiment)

Figure 1:
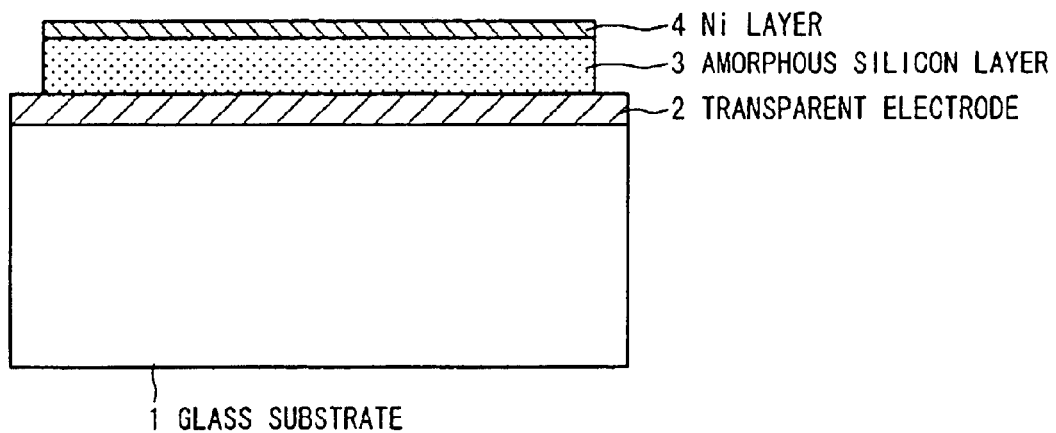
FIG. 1 is a schematic cross-sectional view showing a halfway stage in the production of a solar cell according to a first preferred embodiment of the invention.
Figure 2:
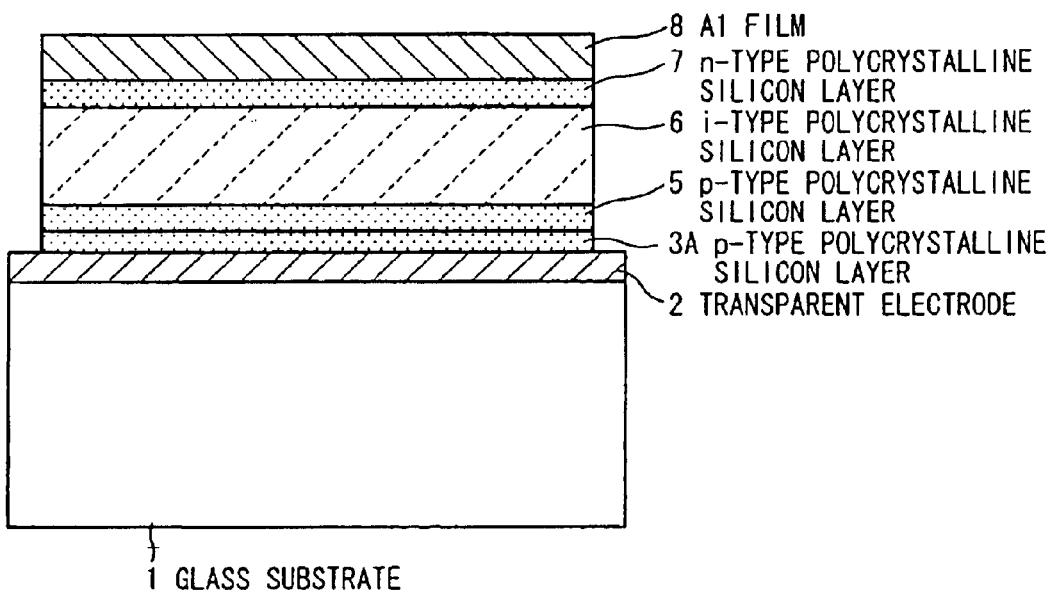
FIG. 2 is a schematic cross-sectional view showing the completed state of the solar cell shown in FIG. 1.

FIGS. 1 and 2 show a first preferred embodiment of the crystalline silicon thin film semiconductor device (a crystalline silicon thin film photovoltaic device, that is, a pin-type solar cell) according to the invention. Here FIG. 1 shows the halfway stage in the first preferred embodiment of the invention. FIG. 2 shows the completed state of the crystalline silicon thin film semiconductor device shown in FIG. 1. The semiconductor device according to this preferred embodiment comprises: a substrate comprising a glass substrate and, provided on one side of the glass substrate, a transparent electrode composed mainly of tin oxide; and a solar cell provided on the transparent electrode.

As shown in FIG. 1, the substrate comprised an 800 nm-thick transparent electrode 2 provided on a glass substrate 1 in its main surface. $SnO_2$ was used as the transparent electrode 2, and concaves and convexes were provided on the surface of the transparent electrode 2 (in FIG. 1, concaves and convexes are not shown). A 20 nm-thick p-type dopant-containing amorphous silicon layer 3 was formed by p-CVD (plasma CVD) at a frequency of 60 MHz under conditions such that a mixed gas composed of $H_2$, $SiH_4$ (silane), and $B_2H_6$ (diborane) was introduced onto the surface of the transparent electrode 2, the pressure was maintained at 0.5 Torr, and the substrate temperature was brought to 420° C. The thickness of the amorphous silicon layer 3 was not more than 50 nm, and is preferably small as much as possible. This is because, in crystallization using a metal catalyst element, the amorphous silicon layer 3 is used as a seed crystal.

Next, a 1 nm-thick layer 4 of nickel as a metal catalyst element was formed by vacuum evaporation, followed by heat treatment in a nitrogen atmosphere at a temperature of 450 to 700° C. (specifically, in the temperature range of 500 to 600° C.) to diffuse the metal catalyst element (nickel). The heat treatment is not limited to the treatment in the nitrogen atmosphere, and the same crystallization effect as attained in the heat treatment in the nitrogen atmosphere was obtained in the heat treatment in a vacuum atmosphere, a hydrogen atmosphere, an argon atmosphere, or a halide atmosphere.

Further, heat treatment was carried out in two stages. Heating was first carried out in a hydrogen atmosphere at 400° C. to bring the content of hydrogen in the amorphous silicon layer 3 to not more than 1%, preferably not more than 0.3%. Next, heating at 550° C. was carried out. As a result, a highly crystallographically oriented p-type polycrystalline silicon layer 3A (shown in FIG. 2) was formed. The crystallographic orientation of the polycrystalline silicon layer 3A was (110). In the above process, an amorphous silicon layer 3 was first formed on the glass substrate 1, and a metal catalyst element was then introduced. Alternatively, a process may be adopted wherein a metal catalyst layer (a nickel layer 4) is first deposited directly on the glass substrate 1 and an amorphous silicon layer 3 is then formed.

In addition to nickel, iron, cobalt, platinum, copper, gold and the like may be used as the metal catalyst element. Methods usable for the formation of the metal catalyst layer include: in the formation of the metal catalyst layer in a film form, plasma treatment, vacuum evaporation, spin coating and the like; and in the formation of the metal catalyst layer in a line or island form, vacuum evaporation in such a state that portions not to be deposited are covered with a metal mask.

Further, methods usable for introduction into the layer include, for example, ion implantation and plasma doping. Since the metal catalyst layer is used for catalytic effect purposes, the concentration of the element may be very low. In general, the metal catalyst layer has a multi-layer structure of two or three layers of which the total thickness is several angstroms. However, the metal catalyst layer may have a single layer structure so far as the catalyst metal advances, through the surface layer to be crystallized, with the progress of the reaction and, when the catalyst metal has reached the opposed side, the whole surface layer is in the crystallized state. When the quality of the seed crystal is not important, the crystallization may be carried out under conditions such that the catalyst metal stays in the layer.

In the above heat treatment, the metal catalyst element is diffused into the amorphous silicon layer 3 and precipitates at a portion around between the amorphous silicon layer 3 on its side remote from the metal catalyst layer and the transparent electrode layer 2 (that is, the metal catalyst element migrates to the outermost surface of the p-type polycrystalline silicon layer 3A), and only a trace amount of metal catalyst element stays within the polycrystalline silicon layer 3A. Therefore, a high-quality p-type polycrystalline silicon layer 3A could be formed. When the crystallizability is poor, the nickel atom is left in the layer. Since, however, only not more than 2% of the thickness of the whole solar cell device is accounted for by the seed crystal portion, the stay of nickel atom in the layer does not greatly affect the performance of the solar cell device.

Thus, even when the thickness of the polycrystalline silicon layer 3A of nickel-containing seed crystal is not more than 5 nm, the quality is not deteriorated and a high-quality device, wherein a major portion, which contributes to power generation, does not contain nickel, can be produced. Further, at a junction, important to the solar cell device, where crystalline layers, which are different from each other in conductivity type, are in contact with each other, there is neither residual metal catalyst nor damage attributable, for example, to etching of that site. Therefore, the formation of an ideal junction can be realized.

Next, a 40 nm-thick p-conductivity-type polycrystalline silicon layer 5 was formed by 60 MHz-p-CVD under conditions such that a mixed gas composed of $B_2H_6$, $H_2$, and $SiH_4$ was introduced, the pressure was maintained at 0.5 Torr, and the substrate temperature was 200° C. Subsequently, an i-type polycrystalline silicon layer 6 was formed by 60 MHz-p-CVD under conditions such that $H_2$ and $SiH_4$ were introduced and the substrate temperature was 300° C. In this case, the thickness is one necessary for light absorption, and is at least not less than 500 nm, preferably about 10 μm. However, a thickness up to about 50 μm may be adopted. At that time, the content of hydrogen in the layer was 0.5 to 8% according to the conditions. Since the polycrystalline silicon layer 5 was formed on the silicon layer 3A, which had been crystallized by the metal catalyst, as the substrate, the crystallographic orientation was the same as that of the silicon layer 3A, that is, was (110). As compared with the formation of the silicon layer directly on a glass substrate or the like, the crystallinity was very good, and, thus, the assembly was suitable for solar cell devices.

Further, a 50 nm-thick n-type polycrystalline silicon layer 7 was formed on the i-type polycrystalline silicon layer 6 as the substrate by 13.56 MHz-p-CVD under conditions such that a mixed gas composed of $H_2$, $SiH_4$, and $PH_3$ (phosphine) was introduced, the pressure was maintained at 0.3 Torr, and the substrate temperature was 200° C. The optimal thickness of the polycrystalline silicon layer 7 varies depending upon the crystallinity. However, the suitable thickness was 10 nm to 100 nm, preferably 30 nm to 60 nm. Finally, a 1 μm-thick aluminum film 8 was formed as a backside electrode using vacuum evaporation.

For devices of the above type, 50-stage connection was carried out by a conventional connection method wherein the surface electrode and the backside electrode in the independent devices on the substrate are connected in series. As a result, the characteristics were such that the output voltage was substantially the sum of output voltages in the respective blocks.

In the above construction, substrate materials include, for example, ceramics, quartz, and sapphire. Although the aluminum film was used as the backside electrode, silver, molybdenum and other metals may also be used.

In the construction of the first preferred embodiment, a glass substrate is used and light is introduced through this glass substrate. Alternatively, a construction may also be adopted wherein a metal substrate is used instead of the glass substrate and light is introduced through the surface of the thin film. Examples of this construction will be described below.

(Second Preferred Embodiment)

Figure 3:
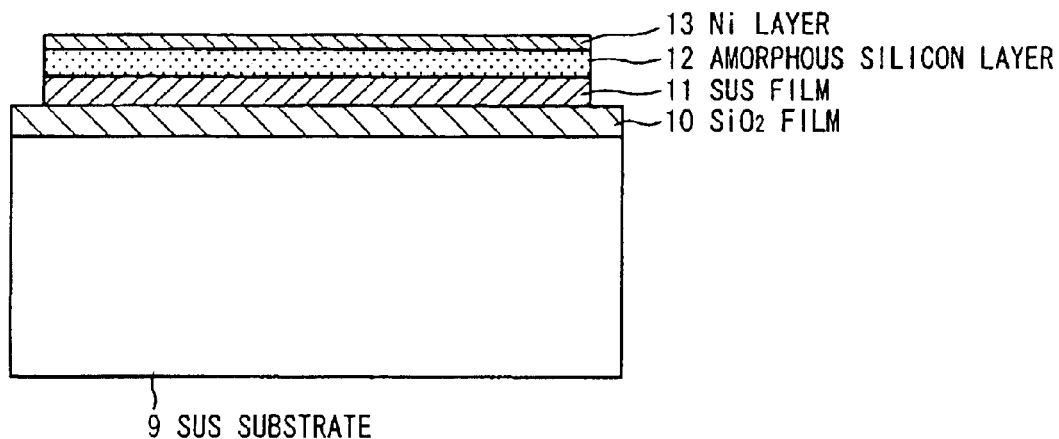
FIG. 3 is a schematic cross-sectional view showing a halfway stage in the production of a solar cell according to a second preferred embodiment of the invention.
Figure 4:
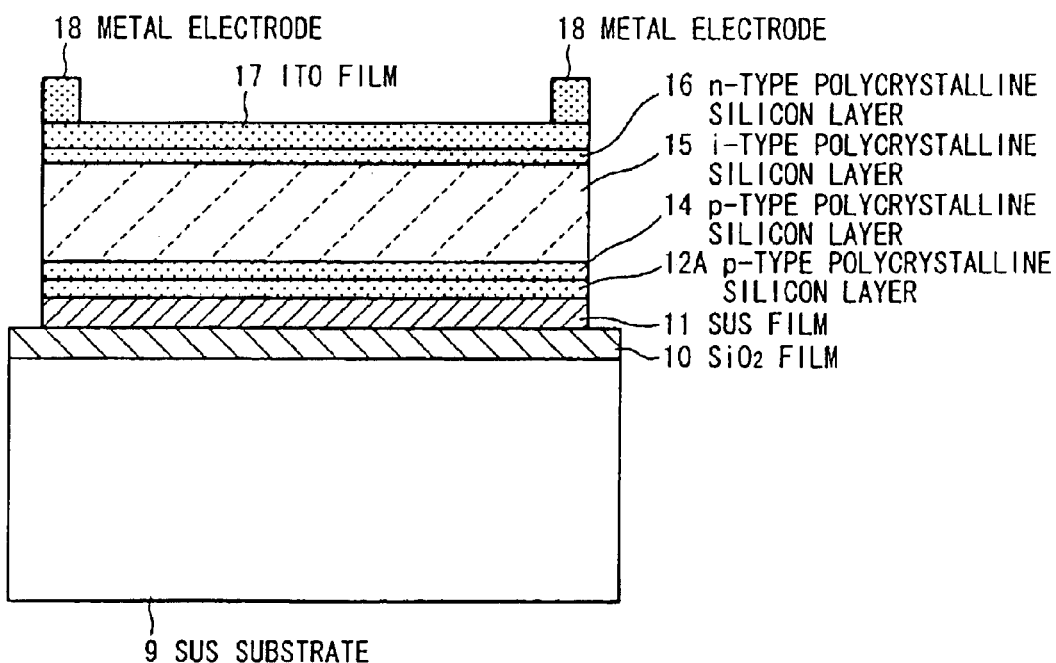
FIG. 4 is a schematic cross-sectional view showing the completed state of the solar cell shown in FIG. 3.

FIGS. 3 and 4 show a second preferred embodiment of the crystalline silicon thin film semiconductor device (a pin-type solar cell) according to the invention. FIG. 3 shows the halfway stage in the production of the solar cell, and FIG. 4 shows the completed state of the solar cell.

A 200 nm-thick $SiO_2$ film 10 was formed as an insulating film on a flexible SUS substrate 9. A 500 nm-thick SUS film 11 was then formed as a backside electrode on the surface of the $SiO_2$ film 10. Next, a 10 nm-thick p-type dopant-containing amorphous silicon layer 12 was sputtered using a silicon target on the SUS film 11. The content of hydrogen in the $SiO_2$ film 10 was not more than 0.1%. Further, a nickel salt solution was spin coated on the surface of the amorphous silicon layer 12, and the coating was dried to form a nickel layer 13.

Subsequently, the assembly was heat treated in a hydrogen atmosphere of 1 Torr at 550° C. for 30 min to crystallize the amorphous silicon layer 12, thereby converting the amorphous silicon layer 12 to a p-type polycrystalline silicon layer 12A (FIG. 4). At that time, nickel in the nickel layer 13 precipitated around the interface of the SUS film 11 and the p-type polycrystalline silicon layer 12A, and was not substantially left in the p-type polycrystalline silicon layer 12A. Further, since hydrogen was substantially absent in the p-type polycrystalline silicon layer 12A, the crystallization smoothly proceeded. A 40 nm-thick substantially p-conductivity-type polycrystalline silicon layer 14 was formed by 60 MHz-p-CVD under conditions such that a mixed gas composed of $B_2H_6$, $H_2$, and $SiH_4$ was introduced onto the p-type polycrystalline silicon layer 12A, the pressure was maintained at 0.5 Torr, and the substrate temperature was 200° C. Thereafter, a 2 μm-thick substantially i-type polycrystalline silicon layer 15 was formed by 60 MHz-p-CVD under conditions such that a mixed gas composed of $H_2$ and $SiH_4$ was introduced and the substrate temperature was 300° C.

Further, a 20 nm-thick n-type polycrystalline silicon layer 16 was formed by 13.56 MHz-p-CVD under conditions such that a mixed gas composed of $H_2$, $SiH_4$, and $PH_3$ was introduced, the pressure was maintained at 0.3 Torr, and the substrate temperature was 300° C. A 70 nm-thick ITO (indium tin oxide) film 17 was formed as a transparent electrode, and a 1 μm-thick metal electrode 18 of aluminum was formed on a part of the transparent electrode. In this case, the crystallographic orientation of each of the polycrystalline silicon layers 14, 15, 16 was (110). The crystallographic orientation of the polycrystalline silicon layer 16 can also be brought to (111) according to p-CVD conditions. In polycrystalline silicon with the crystallographic orientation being (110), the surface was naturally textured as compared with the polycrystalline silicon with the crystallographic orientation being (111).

FIRST COMPARATIVE EXAMPLE

In preparing a thin film polycrystalline silicon solar cell device, a commonly used conventional method is to form all the polycrystalline silicon layers by p-CVD. A thin film polycrystalline silicon solar cell having the same structure as that of the first preferred embodiment of the invention was prepared by this method, which will be described below in detail, and was compared with the thin film polycrystalline silicon solar cell according to the invention.

Specifically, the p-type polycrystalline silicon layer was formed by 50 MHz-p-CVD under conditions such that a mixed gas composed of $H_2$, $SiH_4$, and $B_2H_6$ was introduced, the pressure was maintained at 0.5 Torr, and the substrate temperature was 200° C. The i layer was formed by 60 MHz-p-CVD under conditions such that a mixed gas composed of $H_2$ and $SiH_4$ was introduced, the pressure was maintained at 0.5 Torr, and the substrate temperature was 300° C. The n layer was formed by 13.56 MHz-p-CVD under conditions such that a mixed gas composed of $H_2$, $SiH_4$, and $PH_3$ was introduced, the pressure was maintained at 0.3 Torr, and the substrate temperature was 300° C.

For the solar cell device thus prepared, the current-voltage measurement was carried out. As a result, there was a change in a curve fill factor FF as a measure of the performance of solar cells. Here $FF=P_{max}/(V_{oc} \times J_{sc})$ wherein $P_{max}$ represents the maximum output, $V_{oc}$ represents release voltage, and $J_{sc}$ represents short-circuit photo-current density. Specifically, for the polycrystalline silicon solar cell device according to the first preferred embodiment, the fill factor FF was 1.47 times that of the polycrystalline silicon solar cell device of the first comparative example. Thus, by virtue of the use of the p layer (polycrystalline silicon layer 12A), which has been crystallized by the metal catalyst, as a seed crystal, the polycrystalline silicon solar cell device according to the first preferred embodiment of the invention had better characteristics than the solar cell device of the first comparative example wherein all the polycrystalline silicon layers were formed by p-CVD.

SECOND COMPARATIVE EXAMPLE

A polycrystalline silicon solar cell device of the second comparative example having the same structure as that according to the second preferred embodiment of the invention was prepared by p-CVD in the same manner as in the first comparative example. The polycrystalline silicon solar cell device thus obtained was compared with the polycrystalline silicon solar cell device according to the second preferred embodiment of the invention. As a result, the fill factor FF of the polycrystalline silicon solar cell device according to the second preferred embodiment of the invention was 1.44 times that of the polycrystalline silicon solar cell device of the second comparative example. As with the first preferred embodiment, in the second preferred embodiment of the invention, by virtue of the use of the p layer, which has been crystallized by the metal catalyst, as a seed crystal, the solar cell device had better characteristics than that produced by the conventional method.

(Third Preferred Embodiment)

Next, the third preferred embodiment of the invention will be explained. In the first and second preferred embodiments, for the amorphous silicon layers 3, 12, which have been crystallized by introducing a metal catalyst, the crystallographic orientation of the resultant crystalline layers was (110). On the other hand, in the third preferred embodiment, an 18 nm-thick p-conductivity-type dopant-containing amorphous silicon layer was formed on the transparent electrode 2 in the first preferred embodiment, and an about 2 nm-thick polycrystalline silicon layer was formed on the amorphous silicon layer by p-CVD in a VHF (very high frequency) region while introducing a mixed gas composed of $H_2$, $SiH_4$ and $B_2H_6$ under conditions such that the crystallographic orientation was brought to (111). Subsequently, an about 2 nm-thick nickel layer was formed by vacuum evaporation on the polycrystalline silicon layer with the crystallographic orientation being (111), followed by heat treatment at 500° C. for one hr. The crystallographic orientation of the polycrystalline silicon layer, which had been converted from the amorphous silicon layer by the heat treatment, was (111). A pin structure was then formed in the same manner as in the first preferred embodiment. As a result, for all the silicon layers, the crystallographic orientation was (111). This solar cell device according to the third preferred embodiment was measured for electric characteristics. As a result, it was found that the fill factor FF was 0.98 time that of the solar cell device according to the first preferred embodiment of the invention.

In the above preferred embodiments, solar cell devices having a pin structure were prepared. Since, however, the crystalline silicon produced according to the production process of the invention has good characteristics, the production of pn-type solar cells has also become possible. This pn-type solar cell will be explained as the fourth preferred embodiment.

(Fourth Preferred Embodiment)

FIG. 5 shows the fourth preferred embodiment of the invention, wherein a pn-type solar cell as a crystalline silicon thin film photovoltaic device is provided on a glass substrate. Specifically, a 200 nm-thick $SiO_2$ film 19 was formed as an insulating layer on a glass substrate 27. Further, a 500 nm-thick SUS film 20 was formed as a backside electrode. Subsequently, a 10 nm-thick n-type dopant-containing amorphous silicon layer 21 was formed by sputtering. A 2 nm-thick nickel catalyst layer (not shown) as shown in FIGS. 2 or 4 was formed on the amorphous silicon layer 21, followed by heat treatment at 500° C. to convert the amorphous silicon layer 21 to a polycrystalline silicon layer 22A. VHF p-CvD was carried out using this polycrystalline silicon layer 22A as a seed crystal to form a 2 μm-thick n-type polycrystalline silicon layer (not shown). This n-type polycrystalline silicon layer had a resistance of 20 to 100 Ωm. Further, a 500 nm-thick p-type polycrystalline silicon layer 23 was formed on the n-type polycrystalline silicon layer by VHF p-CVD. This p-type polycrystalline silicon layer 23 had a resistance of 0.1 to 30 Ωcm. Further, a 70 nm-thick ITO film 24 as a transparent electrode was formed on the p-type polycrystalline silicon layer 23. An aluminum film 25 as a electrode was formed on the ITO film 24, and a metal electrode 26 was formed on a part of the aluminum film 25.

For the solar cell according to the fourth preferred embodiment, 50-stage connection was carried out in such a manner that the backside electrode and the surface electrode were connected in series. As a result, the characteristics were such that the output voltage was the sum of output voltages in the respective blocks.

FIG. 6 shows the fifth preferred embodiment of the invention, wherein a pin-type solar cell as a silicon thin film photovoltaic device is provided on a glass substrate. Specifically, a transparent electrode 29 was formed on a glass substrate 28. $SnO_2$ was used as the transparent electrode 29. A nickel catalyst layer was formed on the transparent electrode 29, and a 20 nm-thick n-type dopant-containing amorphous silicon layer was then formed, followed by the diffusion of a nickel metal catalyst layer in a nitrogen atmosphere of 550° C. to crystallize the amorphous silicon layer. Subsequently, a 40 nm-thick p-type polycrystalline silicon layer 31 was formed by plasma CVD in a VHF (very high frequency) region while introducing a mixed gas composed of $H_2$, $SiH_4$, and $B_2H_6$. The crystallographic orientation of this polycrystalline silicon layer 31 was (111). Further, a 1 μm-thick i-type polycrystalline silicon layer 32 was formed by VHF plasma CVD while introducing a mixed gas composed of $H_2$ and $SiH_4$. A 50 nm-thick n-type polycrystalline silicon layer 33 was then formed by VHF plasma CVD while introducing a mixed gas composed of $PH_3$, $H_2$, and $SiH_4$. The crystallographic orientation of the i layer and the n layer could be brought to (110) under certain conditions. Finally, a 1 μm-thick aluminum film 34 was formed as a backside electrode by vacuum evaporation. The surface of this polycrystalline silicon thin film had a textured structure which is suitable as a photovoltaic device. Further, since the p layer as the substrate has high crystallinity, this device had higher characteristics than the device wherein the p layer was formed directly on $SnO_2$ by plasma CVD.

THIRD COMPARATIVE EXAMPLE

A solar cell device of the third comparative example having the same structure as the solar cell device according to the fifth preferred embodiment was formed by plasma CVD only. The characteristics of the solar cell device of the third comparative example were compared with those of the solar cell device of the fifth preferred embodiment. As a result, the fill factor FF of the solar cell device of the fifth preferred embodiment was 1.51 times that of the solar cell device of the third comparative example. Thus, by virtue of crystallization using a metal catalyst, the solar cell device of the fifth preferred embodiment had better characteristics than the solar cell device produced by the conventional method.

The above-described crystalline silicone thin film semiconductor devices and crystalline silicon thin film photovoltaic devices according to the invention, when applied to solar cells, can be utilized in various applications, for example, domestic power supply systems and, in addition, portable equipment, such as electronic calculators and watches.

As described above, the crystalline silicon thin film semiconductor device according to the invention comprises: a first polycrystalline silicon layer which has been formed by introducing a metal catalyst element into an amorphous silicon layer, provided on a substrate, or so as to come into contact with the amorphous silicon layer, and then heat treating the amorphous silicon layer to convert the amorphous silicon layer at a low temperature to a crystallographically oriented polycrystalline silicon layer through the action of the metal catalyst element; a second polycrystalline silicon layer which has been formed, using the first polycrystalline silicon layer as a seed crystal, so as to have high crystallinity and the same crystallographic orientation as the first polycrystalline silicon layer; and a third polycrystalline silicon layer which has been formed using the second polycrystalline silicon layer as a substrate. By virtue of this construction, the crystalline silicon thin film semiconductor device has high crystallinity, crystallographic orientation, high characteristics, and excellent productivity. In particular, a thin film solar cell can be easily formed on an inexpensive substrate, such as a glass substrate, and a high-performance crystalline silicon thin film semiconductor device can be produced at low cost. Further, silicide-derived defects do not take place because no silicide is left at a junction with other conductivity type.

The crystalline silicon thin film photovoltaic device according to the invention comprises: a first polycrystalline silicon layer which has been formed by introducing a metal catalyst element into an amorphous silicon layer, provided on a substrate, or so as to come into contact with the amorphous silicon layer, and then heat treating the amorphous silicon layer to convert the amorphous silicon layer to a crystallographically oriented polycrystalline silicon layer through the action of the metal catalyst element; a second polycrystalline silicon layer which has been formed, using the first polycrystalline silicon layer as a seed crystal, on the surface of the first polycrystalline silicon layer and has the same crystallographic orientation as the first polycrystalline silicon layer and has high crystallinity; and a third polycrystalline silicon layer which is provided on the second polycrystalline silicon layer and has high crystallinity and crystallographic orientation. By virtue of this construction, the crystalline silicon thin film photovoltaic device has high crystallinity, excellent crystallographic orientation, high characteristics, and excellent productivity.

Further, the production process of a crystalline silicon thin film semiconductor device according to the invention comprises the steps of: forming an amorphous silicon thin film on the surface of a substrate; introducing a metal catalyst element into the amorphous silicon layer or so as to come into contact with the surface portion of the amorphous silicon layer, and heat treating the amorphous silicon layer to crystallize the amorphous silicon layer at a low temperature and to form a crystallographically oriented first polycrystalline silicon layer; forming, on the first polycrystalline silicon layer, a second polycrystalline silicon layer, of the same conductivity type and crystallographic orientation as the first polycrystalline silicon layer, using the first polycrystalline silicon layer as a seed crystal; and forming, on the second polycrystalline silicon layer, a third polycrystalline silicon layer of a conductivity type which is different from the conductivity type of the second polycrystalline silicon layer. By virtue of this constitution, a crystalline silicon thin film semiconductor device can be produced which has high crystallinity, crystallographic orientation, high characteristics, and excellent productivity. In particular, when the invention is applied to thin film solar cells, inexpensive substrates, such as glass substrates, can be used. This can realize the production of high-performance semiconductor devices at low cost.

The invention has been described in detail with particular reference to preferred embodiments, but it will be understood that variations and modifications can be effected within the scope of the invention as set forth in the appended claims.

What is claimed is:

1. A crystalline silicon thin film photovoltaic device comprising:
   a conductive substrate or a substrate having on its surface a conductive layer;
   a crystallographically oriented first polycrystalline silicon layer, which has been formed by introducing a metal catalyst element (i) into, or (ii) so as to come into contact with a surface portion of, an amorphous silicon layer, the amorphous silicon layer being formed on the surface of the conductive substrate or the conductive layer, and heat treating the amorphous silicon layer to crystallize the amorphous silicon layer; and
   a second polycrystalline silicon layer which has been formed without catalytic effect, using the first polycrystalline silicon layer as a seed crystal, so as to have the same conductivity type as the first polycrystalline silicon layer.

2. The crystalline silicon thin film photovoltaic device according to claim 1, wherein the second polycrystalline silicon layer contains not less than 0.1% of hydrogen.

3. The crystalline silicon thin film photovoltaic device according to claim 1, wherein the second polycrystalline silicon layer is crystallographically oriented in the thickness wise direction.

4. The crystalline silicon thin film photovoltaic device according to claim 1, wherein the second polycrystalline silicon layer has the same crystallographic orientation as the first polycrystalline silicon layer.

5. The crystalline silicon thin film photovoltaic device according to claim 1, which further comprises, provided on the second polycrystalline silicon layer in its side remote from the first polycrystalline silicon layer, a third polycrystalline silicon layer of a second conductivity type which is different from the conductivity type of the second polycrystalline silicon layer.

6. The crystalline silicon thin film photovoltaic device according to claim 5, which further comprises, provided between the third polycrystalline silicon layer and the second polycrystalline silicon layer, a fourth polycrystalline silicon layer of a third conductivity type which is different from the conductivity type of the second polycrystalline silicon layer and the conductivity type of the third polycrystalline silicon layer.

7. The crystalline silicon thin film photovoltaic device according to claim 6, wherein the fourth polycrystalline silicon layer has the same crystallographic orientation as the second polycrystalline silicon layer.

8. The crystalline silicon thin film photovoltaic device according to claim 6, wherein the fourth polycrystalline silicon layer has the same crystallographic orientation as the third polycrystalline silicon layer.

9. The crystalline silicon thin film photovoltaic device according to claim 5, wherein the third polycrystalline silicon layer has the same crystallographic orientation as the second polycrystalline silicon layer.

10. The crystalline silicon thin film photovoltaic device according to claim 5, wherein the third and fourth polycrystalline silicon layers contain not less than 0.1% of hydrogen.

11. The crystalline silicon thin film photovoltaic device according to claim 1, wherein the amorphous silicon layer is formed directly on the surface of the conductive substrate or the conductive layer.

12. A crystalline silicon thin film photovoltaic device comprising:
- a conductive substrate or an insulating substrate having on its surface a conductive layer;
- a first polycrystalline silicon layer of a first conductivity type which has been formed by introducing a metal catalyst element (i) into, or (ii) so as to come into contact with a surface portion of, an amorphous silicon layer, the amorphous silicon layer being formed on the surface of the conductive substrate or the conductive layer, and heat treating the amorphous silicon layer to crystallize the amorphous silicon layer;
- a second polycrystalline silicon layer which has been formed without catalytic effect, using the first polycrystalline silicon layer as a seed crystal, so as to have the same conductivity type as the first conductivity type;
- a substantially i-type third polycrystalline silicon layer formed, without catalytic effect, on the second polycrystalline silicon layer;
- a fourth polycrystalline silicon layer that is formed, without catalytic effect, on the third polycrystalline silicon layer and is of a second conductivity type which is different from the first conductivity type; and
- an electrode part provided on the fourth polycrystalline silicon layer.

13. The crystalline silicon thin film photovoltaic device according to claim 12, wherein:
- the conductive substrate is stainless steel; and
- the substrate having on its surface a conductive layer is glass.

14. The crystalline silicon thin film photovoltaic device according to claim 12, wherein the amorphous silicon layer is formed directly on the surface of the conductive substrate or the conductive layer.

15. A crystalline silicon thin film photovoltaic device comprising:
- an insulating substrate having on its surface an electrode;
- a first polycrystalline silicon layer of a first conductivity type which has been formed by introducing a metal catalyst element (i) into, or (ii) so as to come into contact with a surface portion of, an amorphous silicon layer, the amorphous silicon layer being formed on the electrode of the insulating substrate, and heat treating the amorphous silicon layer to crystallize the amorphous silicon layer;
- a second polycrystalline silicon layer which has been formed without catalytic effect, using the first polycrystalline silicon layer as a seed crystal, so as to have the same conductivity type as the first conductivity type;
- a third polycrystalline silicon layer which is formed without catalytic effect on the second polycrystalline silicon layer and is of a second conductivity type which is different from the first conductivity type; and
- an electrode part provided on the third polycrystalline silicon layer.

16. The crystalline silicon thin film photovoltaic device according to claim 15, wherein the amorphous silicon layer is formed directly on the electrode of the insulating substrate.

17. A crystalline silicon thin film photovoltaic device, comprising:
- a conductive substrate or a substrate having on its surface a conductive layer;
- a first polycrystalline silicon layer having a first conductivity type, formed of (i) an amorphous silicon layer disposed on the surface of the conductive substrate or the conductive layer, and (ii) a metal catalyst element introduced into, or into contact with a surface portion of, the amorphous silicon layer, with the amorphous silicon layer being crystallized by heat treatment; and
- a second polycrystalline silicon layer, having the same conductivity type as the first polycrystalline silicon layer, and being formed using the first polycrystalline silicon layer as a seed crystal wherein said second polycrystalline silicon layer does not contain the metal catalyst element.

18. The crystalline silicon thin film photovoltaic device according to claim 17, wherein:
- the second polycrystalline silicon layer is formed by plasma CVD.

19. The crystalline silicon thin film photovoltaic device according to claim 17, wherein:
- the second polycrystalline silicon layer is formed at a temperature of approximately 300° C. or less.

20. The crystalline silicon thin film photovoltaic device according to claim 17, wherein:
- the second polycrystalline silicon layer is formed without the metal catalyst element acting as a catalyst.

21. The crystalline silicon thin film photovoltaic device according to claim 17, wherein the amorphous silicon layer is disposed directly on the surface of the conductive substrate or the conductive layer.

22. A crystalline silicon thin film photovoltaic device comprising:
- a conductive substrate or a substrate having on its surface a conductive layer;
- a crystallographically oriented first polycrystalline silicon layer containing a metal catalyst element and transformed from an amorphous silicon layer through annealing with the help of said metal catalyst element, the first polycrystalline silicon layer being formed on the surface of the conductive substrate or the conductive layer; and
- a second polycrystalline silicon layer formed by using the first polycrystalline silicon layer as a seed crystal, the second polycrystalline silicon layer containing no metal catalyst element and having the same conductivity type as the first polycrystalline silicon layer.

23. The crystalline silicon thin film photovoltaic device according to claim 22, wherein the second polycrystalline silicon layer contains not less than 0.1% of hydrogen.

24. The crystalline silicon thin film photovoltaic device according to claim 22, wherein the second polycrystalline silicon layer is crystallographically oriented in the thickwise direction.

25. The crystalline silicon thin film photovoltaic device according to claim 22, wherein the second polycrystalline silicon layer has the same crystallographic orientation as the first polycrystalline silicon layer.

26. The crystalline silicon thin film photovoltaic device according to claim 22, which further comprises, provided on the second polycrystalline silicon layer in its side remote from the first polycrystalline silicon layer, a third polycrystalline silicon layer of a second conductivity type which is different from the conductivity type of the second polycrystalline silicon layer, the third polycrystalline silicon layer containing no metal catalyst element.

27. The crystalline silicon thin film photovoltaic device according to claim 26, which further comprises, provided between the third polycrystalline silicon layer and the second polycrystalline silicon layer, a fourth polycrystalline silicon layer of a third conductivity type which is different from the conductivity type of the second polycrystalline silicon layer and the conductivity type of the third polycrystalline silicon layer, the fourth polycrystalline silicon layer containing no metal catalyst element.

28. The crystalline silicon thin film photovoltaic device according to claim 27, wherein the fourth polycrystalline silicon layer has the same crystallographic orientation as the second polycrystalline silicon layer.

29. The crystalline silicon thin film photovoltaic device according to claim 28, wherein the fourth polycrystalline silicon layer has the same crystallographic orientation as the third polycrystalline silicon layer.

30. The crystalline silicon thin film photovoltaic device according to claim 27, wherein the fourth polycrystalline silicon layer has the same crystallographic orientation as the third polycrystalline silicon layer.

31. The crystalline silicon thin film photovoltaic device according to claim 27, wherein the third and fourth polycrystalline silicon layers contain not less than 0.1% of hydrogen.

32. The crystalline silicon thin film photovoltaic device according to claim 26, wherein the third polycrystalline silicon layer has the same crystallographic orientation as the second polycrystalline silicon layer.

33. The crystalline silicon thin film photovoltaic device according to claim 26, wherein the third and fourth polycrystalline silicon layers contain not less than 0.1% of hydrogen.

34. The crystalline silicon thin film photovoltaic device according to claim 22, wherein the first polycrystalline silicon layer is formed directly on the surface of the conductive substrate or the conductive layer.

* * * * *